(12) United States Patent
Hsu et al.

(10) Patent No.: US 6,259,126 B1
(45) Date of Patent: Jul. 10, 2001

(54) LOW COST MIXED MEMORY INTEGRATION WITH FERAM

(75) Inventors: Louis Lu-Chen Hsu, Fishkill; Jack A. Mandelman, Stormville; Fariborz Assaderaghi, Mahopac, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/447,628

(22) Filed: Nov. 23, 1999

(51) Int. Cl.$^7$ .......................... H01L 27/108; H01L 29/76; H01L 29/94; H01L 31/119; G11C 13/00

(52) U.S. Cl. .......................... 257/298; 257/303; 257/315; 365/182; 365/51

(58) Field of Search .................................. 257/295, 298, 257/303, 304, 306, 315, 903, 904, 906, 908; 365/182, 185.01, 185.14, 51

(56) References Cited

U.S. PATENT DOCUMENTS

| | | | |
|---|---|---|---|
| 4,646,271 | 2/1987 | Uchiyama et al. | 365/49 |
| 4,703,456 | 10/1987 | Arakawa | 365/185.08 |
| 4,720,323 | 1/1988 | Sato | 438/261 |
| 4,757,360 | 7/1988 | Faraone | 257/317 |
| 4,799,194 | 1/1989 | Arakawa | 365/185.08 |
| 4,813,018 | 3/1989 | Kobayashi et al. | 365/185.08 |
| 4,853,893 | 8/1989 | Eaton, Jr. et al. | 365/145 |
| 4,888,630 | 12/1989 | Paterson | 365/185.24 |
| 5,051,958 | 9/1991 | Arakawa | 365/185.08 |
| 5,057,448 | 10/1991 | Kuroda | 438/241 |
| 5,065,201 | 11/1991 | Yamauchi | 365/185.08 |
| 5,075,888 | 12/1991 | Yamauchi et al. | 365/185.08 |
| 5,189,641 | 2/1993 | Arakawa | 365/185.08 |
| 5,196,722 | 3/1993 | Bergendahl et al. | 257/304 |
| 5,198,994 | 3/1993 | Natori | 365/145 |
| 5,250,827 | 10/1993 | Inoue et al. | 257/295 |
| 5,321,280 * | 6/1994 | Sakai | 257/211 |
| 5,399,516 | 3/1995 | Bergendahl et al. | 438/589 |
| 5,442,210 | 8/1995 | Kanehachi | 257/296 |
| 5,468,983 * | 11/1995 | Hirase et al. | 257/344 |
| 5,488,579 | 1/1996 | Sharma et al. | 365/185.08 |
| 5,496,756 | 3/1996 | Sharma et al. | 438/258 |
| 5,608,246 | 3/1997 | Yeager et al. | 257/295 |
| 5,612,238 * | 3/1997 | Sato et al. | 438/241 |
| 5,626,670 | 5/1997 | Varshney et al. | 117/7 |

(List continued on next page.)

OTHER PUBLICATIONS

Feb. 1999, Electronic Engineering; Field Programming—the Future: A Progress Report by Ron Neale.

Thin Solid Films 270—(1995) 584–588 Ferroelectric non–volatile memories for low–voltage, low power applications, by R.F. Jones., Jr., et al.

IEEE—1997—A High Stability Electrode Technology for Stacked SrBi2Ta2)9 Capacitors Applicable to Advanced Ferroelectric Memory by J. Kudo, et al.

Advanced 0.5 um FRAM Device Technology With Full Compatibility of Half–Micron CMOS Logic Device IEEE 197 by Tatsuya Yamzaki, et al.

IBM Docket No.FI9–97–011US3 filed Aug. 31, 1999 s/n 09/387,059; Assaderaghi, et al. entitled: New Structure For Low Cost Mixed Memory Integration, New NVRAM Structure, and Process for Forming the Mixed Memory and NVRAM Structures.

English Abstract of JP1293569, Nov. 27, 1989.

*Primary Examiner*—Olik Chaudhuri
*Assistant Examiner*—Hoai Pham
(74) *Attorney, Agent, or Firm*—Joseph P. Abate, Esq.

(57) ABSTRACT

A semiconductor memory device including at least three different types of memory cell structures. The types include an NVRAM cell structure, an FERAM cell structure, a DRAM cell structure, and an SRAM cell structure. The cell structures are disposed on the same substrate.

7 Claims, 12 Drawing Sheets

U.S. PATENT DOCUMENTS

| | | | |
|---|---|---|---|
| 5,739,566 * | 4/1998 | Ota | 257/315 |
| 5,850,089 | 12/1998 | Varshney et al. | 257/295 |
| 5,850,231 | 12/1998 | Orimoto et al. | 345/507 |
| 5,866,451 * | 2/1999 | Yoo et al. | 438/241 |
| 5,877,525 | 3/1999 | Ahn | 257/321 |
| 5,880,991 | 3/1999 | Hsu et al. | 365/182 |
| 5,909,624 | 6/1999 | Yeager et al. | 438/396 |
| 5,915,167 * | 6/1999 | Leedy | 436/108 |
| 5,923,062 * | 7/1999 | Ohmo | 257/298 |
| 6,144,052 * | 11/2000 | Kushida et al. | 257/295 |

* cited by examiner

LOW COST MIXED MEMORY INTEGRATION WITH FERAM

This application relates to commonly-owned patent application which is application Ser. No. 09/447,629, now U.S. Pat. No. 6,141,242 entitled Low Cost Mixed Memory Integration with Substantially Coplanar Gate Surfaces by Hsu, et al, filed simultaneously herewith and also to commonly-owned patent application Ser. No. 09/387,059 filed Aug. 31, 1999, entitled New Structure for Low Cost Mixed Memory Integration, New NVRAM Structure, and Process for Forming the Mixed Memory and NVRAM Structures by Hsu, et al.

This application relates also to application Ser. No. 09/159,470, filed Sep. 23, 1998, which is a division of application Ser. No. 09/824,702, filed Apr. 14, 1997—now U.S. Pat. No. 5,880,991, all commonly-owned.

FIELD OF THE INVENTION

The present invention relates to a new memory structure for use in high density memory chips. In particular, the present invention provides a memory structure that includes non-volatile memory such as NVRAM memory structures and/or FERAM memory structures, and/or volatile memory such as DRAM and/or SRAM memory structures on one substrate. The present invention also includes a new NVRAM cell structure. Additionally, the present invention relates to processes for forming a memory structure that includes NVRAM, FERAM, DRAM, and/or SRAM memory structures on one substrate, and processes for forming a new NVRAM cell structure for system-on-chip (SOC) and/or embedded applications.

BACKGROUND OF THE INVENTION

Laser fusible redundancy technology plays a key role for improving the yield of today's high density memory chips. However, disadvantages exist associated with such technology. For example, devices produced according to the technology are bulky and costly in terms of chip area. The fuse blowing process that may occur in devices according to this technology may not operate as desired. The fuse blowing process is time consuming and unreliable, and the fuses are not reprogrammable.

As memory circuits become more sophisticated, it is often necessary to incorporate a block of EEPROM into other memory arrays, such as DRAM or SRAM. One example of such a device is a "smart card". In a smart card, RAM serves as a scratch pad, ROM stores programs and runs the card's operating system, EEPROM includes user data, and a microcontroller allocates the memory and runs an encryption program. One example of a smart card is described in John Gallant, Smart Cards, EDN, Nov. 23, 1995, pp. 34–42, the entire disclosure of which is hereby incorporated by reference.

It is a great challenge to design a high density, small chip size, low cost smart card integrated circuit. Such devices have many inherent problems. For example, chip sizes larger than 0.25 mm$^2$ are prone to experiencing fractures when a card is flexed. Nevertheless, mixed memory process integration will become necessary in, for example, system-on-chip (SOC) applications, where CPU, SRAM type cache, programmable memory arrays, and/or random accessible memory arrays, and/or other devices are integrated in or on the same chip.

SUMMARY OF THE INVENTION

The present invention seeks to overcome the above problems as well as others by providing new memory structures and methods for making the structures.

The present inventors realized that it would be very desirable to replace the fuses described above with non-volatile memory. However, they also realized the difficulties in combining processes for forming different types of memory cells on the same substrate. Known processes for combining different types of memory cells involve many complex process steps, many extra masking levels and material layers to fabricate more than one type of memory cell on a single chip. The present inventors believe that such prior art processes are time consuming and costly, and that the resulting memory structures are non-planarized. Such non-planarized structures result in, for example, depth of focus, lithography, etch and deposition problems. An alternative approach integrated memory cells only on a system level, rather than on the same chip.

The present invention provides a solution to the above difficulties and problems by providing compatible memory cell structures and processes for forming different memory cell structure types on a single substrate.

The present invention also provides a new NVRAM cell structure.

According to preferred aspects, the present invention provides a semiconductor memory device including an NVRAM cell structure, a DRAM cell structure, and an SRAM cell structure on a single substrate.

According to additional preferred aspects, the present invention provides a new NVRAM cell structure that includes an extended planarized floating gate.

According to further preferred aspects, the present invention provides a semiconductor memory device including at least three of the following cell structures: an NVRAM cell structure, an FERAM cell structure, a DRAM cell structure, and an SRAM cell structure on a single substrate.

According to other preferred aspects, the present invention provides processes for forming a semiconductor memory device including an NVRAM cell structure, a DRAM cell structure, and an SRAM cell structure on the same substrate and associated with a plurality of gate structures, including first polysilicon layers. The method includes depositing a second polysilicon layer over the gate structures. A floating gate of an NVRAM cell is formed by patterning the second layer of polysilicon over at least a stud interconnection connected to one of said gate structures on said substrate and associated with a first drain region and a first source region in the substrate. A capacitor of a DRAM cell or an SRAM cell is formed by patterning the second layer of polysilicon over at least a second drain region formed in the substrate. A thin layer of a dielectric is deposited over exposed surfaces of the patterned second polysilicon layer. A third layer of polysilicon is deposited on the patterned second polysilicon layer. A control gate of the NVRAM cell is formed by patterning the third polysilicon layer over the dielectric layer deposited on corresponding patterned portions of the second polysilicon layer. A ground plate of the DRAM cell or the body of a Thin-Film Transistor(TFT) SRAM cell is formed by patterning the third polysilicon layer over the dielectric layer deposited on corresponding patterned portions of the second polysilicon layer.

Preferred aspects of the present invention also include a process(es) to roughen the node dielectric of the DRAM together with the gate dielectric of the TFT device of the SRAM and floating gate dielectric of the NVRAM.

Another alternative aspect of this invention includes roughening only, for example, the node dielectric of the DRAM.

Furthermore, additional preferred aspects of the present invention include a semiconductor memory device formed according to various of the present inventive processes.

An additional alternative aspect of the present invention provides a semiconductor memory device including a Ferro-Electric RAM (FERAM) cell structure in lieu of or together with various of the other memory cell structures.

A further preferred aspect of the present invention includes a semiconductor memory device in which portions of the gates of at least two cell structures are substantially coplanar.

Still other objects and advantages of the present invention will become readily apparent to those skilled in the art from the following description and drawing figures. The detailed description and drawing figures show and describe preferred embodiments of the invention so as to illustrate the best mode contemplated for carrying out the invention. As those skilled in art will realize, the present invention includes other and different embodiments, for example, any combination(s) of the cell structures taught in this disclosure. Details of the invention may be modified in various respects, without departing from the invention.

BRIEF DESCRIPTION OF THE DRAWINGS

FIG. 4a represents another embodiment of an NVRAM cell structure according to the present invention that includes a larger area interfaced between the floating gate and the control gate, wherein the optional roughening of the interface of the dielectric between the floating gate and the control gate is less than the roughening in the embodiment shown in FIG. 3a;

FIGS. 5hh–ll represent cross-sectional views of an alternative embodiment of a semiconductor memory device according to the present invention during certain stages of an alternative embodiment of a manufacturing process according to the present invention;

DETAILED DESCRIPTION OF THE INVENTION

Figure 1:
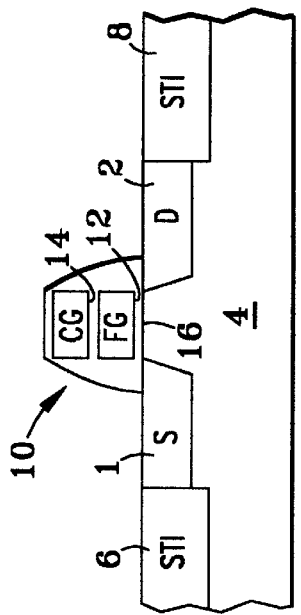
FIG. 1 represents a cross-sectional view of a prior art conventional stacked gate NVRAM cell structure.

FIG. 1 shows a typical known conventional stacked gate NVRAM cell structure. The structure shown in FIG. 1 includes a source region 1 and a drain region 2 formed in a substrate 4. Shallow trench isolation (STI) regions 6 and 8 are formed at the edge of the source and drain region, respectively, in the substrate.

A stacked gate structure 10 is provided on the surface of the substrate 4 above at least a portion of the source region 1 and the drain region 2. As shown in FIG. 1, the floating gate 12 is formed closest to the substrate. The control gate 14 is formed above the floating gate 12.

A very thin insulating layer 16 lies underneath the floating gate 12 between the floating gate and the surface of the substrate 4. The insulating layer 16 permits carriers to be tunneled through a certain voltage level between the drain 2, or substrate 4, and the control gate 14 to program the floating gate 12. Once the device is programmed, the threshold of the device changes. Changes in the threshold can, in turn, determine the "on/off" state of the device.

The insulating layer may be made of an oxide material. Preferably, the insulating material is silicon dioxide.

The conventional stacked gate NVRAM cell structure shown in FIG. 1 is very difficult to integrate with a conventional DRAM, especially a high density trench capacitor DRAM. This is because the trench capacitor of the DRAM must be formed before the gate. Even at the gate level, an extra polysilicon layer is needed for the NVRAM.

The present invention overcomes difficulties in forming NVRAM structures (i.e. non-volatile memory structures) on the same substrate as other (e.g., volatile) memory cell structures. The present invention provides a process compatible for forming NVRAM cell structures, DRAM cell structures, and SRAM cell structures on a single substrate. In addition, the present invention provides a process compatible for forming an FERAM cell structure in combination with any two of the other cell structures. As is understood by those skilled in the art, an FERAM cell structure is also a type of NVRAM cell structure. In providing such a process (es), the present invention reduces time, resource and other cost typically associated with known processes for forming different types of memory cells on one substrate.

Although the present invention provides a process(es) for forming different memory cell structures on a substrate, high voltage devices and related processes might still need to be carried out. However, the extra process steps needed for forming high voltage peripheral devices are not discussed herein.

Examples of high voltage peripheral devices include a charge-pump and boosted W/L driver. These devices require thicker oxide layers so that oxide reliability can be preserved. For an example of a boosted W/L driver, see U.S. Pat. No. 5,513,142, the entire disclosure of which is hereby incorporated by reference. Also, I/O circuits may "see" "high-voltage." Therefore, different oxide thicknesses may be provided for these applications.

The new NVRAM cell structure of the present invention utilizes the topology and material layers from the stacked capacitor DRAM. The present invention utilizes dual polysilicon layers to form a stacked capacitor. This approach may also be utilized in forming a TFT device. When forming the TFT device in this manner, the bottom polysilicon layer may be utilized as a gate of the p-FET load device. The top polysilicon layer may be utilized for the body of the TFT.

Figure 2C:
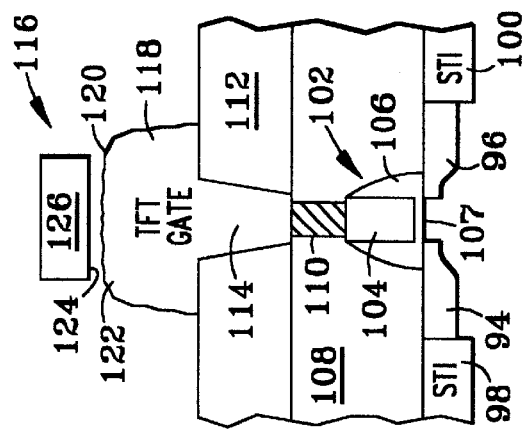
FIGS. 2a–c represent cross-sectional views of an embodiment of a merged memory device according to the present invention that includes embodiments of an NVRAM cell structure, a stacked capacitor DRAM cell structure, and a TFT SRAM cell structure.
Figure 2B:
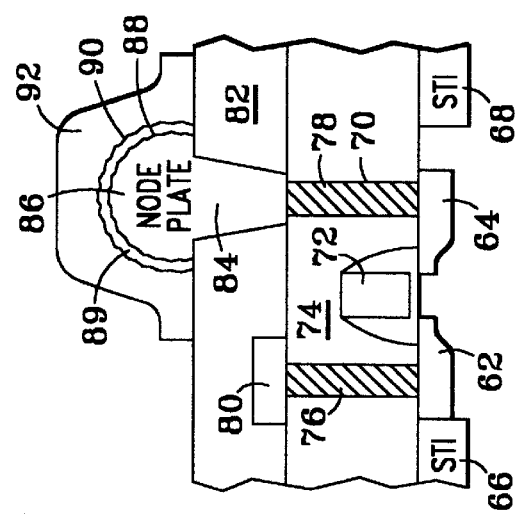
Figure 2A:
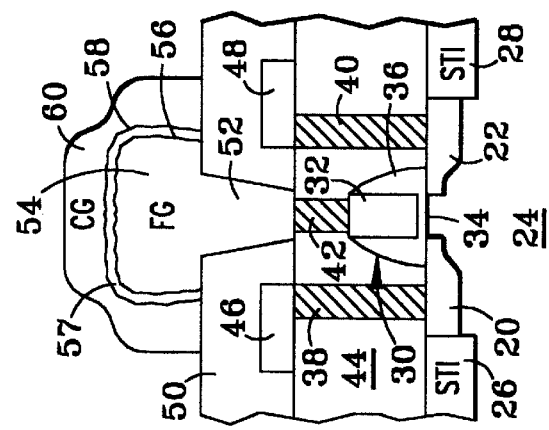

FIGS. 2a, 2b, and 2c show cross-sectional views of an embodiment of a memory device including embodiments of an NVRAM cell structure, a DRAM cell structure, and a SRAM cell structure according to the present invention. In FIGS. 2, 7, 9 and 10, the distance between the lower surface of a lower gate structure (e.g., 32) and the top surface of a substrate (e.g., 24) is shown enlarged from that in FIG. 5 for ease of explanation. The embodiment of the NVRAM cell structure shown in FIG. 2a, includes a source region 20 and a drain region 22 formed in a substrate 24. Again, shallow trench isolation regions 26 and 28 are provided in the substrate adjacent the source and drain regions, respectively.

A gate level is formed on the substrate above at least a portion of both the source region 20 and the drain region 22. The gate level includes the gate structure 32. The gate structure 32 may be separated from the substrate 24 and the source 20 and drain 22 by a thin layer of an insulating material 34. The gate structure 32 may be isolated by region 36.

The insulating material 34 may be an oxide material. Preferably, the insulating material is silicon dioxide.

Stud interconnections 38, 40, and 42 may be formed above the source region 20, drain region 22, and gate structure 32, respectively. As discussed above, the stud interconnections may be formed in different locations in different types of memory cells. The stud interconnections may be formed from a variety of electrically conductive materials. Examples of materials that may be utilized in forming the stud interconnections are polysilicon, tungsten, aluminum, titanium, or tantalum.

In the embodiment shown in FIG. 2a, the stud interconnections and the gate structure are surrounded by a first layer of a dielectric 44. Examples of dielectric materials that may be utilized in the first dielectric layer include CVD oxide.

A first level of metallization may be deposited over the stud interconnections 38, 40 and 42 as well as portions of the dielectric plane 44. The NVRAM cell structure may include both source and bit lines in the first level of metallization. Both the source and bit lines in the NVRAM cell structure may run in a horizontal direction. The metallization may be formed from a variety of electrically conductive materials. Examples of materials that may be utilized in forming the first level metallization include CVD or sputter deposited aluminum, tungsten or copper.

A second dielectric layer may then be laid down over the first dielectric layer, the stud interconnections 38, 40 and 42 and the first level of metallization 46 and 48. As shown in FIG. 2a, a via 52 may be formed in the second dielectric layer 50.

In the via 52, above the via, and in/on the surface of the second dielectric layer 50 surrounding the via, the floating gate (FG) 54 of the NVRAM cell structure is formed. The floating gate may be formed from any suitable material. For example, the floating gate may be made of CVD polysilicon. The polysilicon may be in-situ doped.

According to the present invention, the surface of the floating gate structure 54 may be roughened. The roughening may provide a high coupling coefficient. Methods for roughening such surfaces are known in art. An example of a process that may be utilized for roughening the surface of the floating gate or the other structures described herein includes depositing a layer of amorphous silicon and annealing it to convert it to polycrystalline silicon. Such a method is disclosed by U.S. Pat. No. 4,757,360 to Faraone, issued Jul. 12, 1988, the entire disclosure of which is hereby incorporated by reference. However, the floating gate structure may not be roughened. An extended floating gate according to the invention includes a larger surface area than a conventional gate.

A control gate (CG) 60 preferably is provided over the floating gate 54. If the floating gate surface is roughened, the surface of the control gate 60 adjacent the surface of the floating gate 54 is correspondingly roughened because it is laid down on top of the surface of the floating gate 54.

The roughening of the surfaces where the floating gate and control gate meet may increase the coupling capacitance. The roughened surface increases the effective area of the capacitor. The roughened surfaces may serve as a tunneling oxide with a field enhanced tunneling method. However, it is not necessary to roughen the gate surface.

According to an embodiment wherein the roughened polysilicon oxide is used as the tunneling oxide, the floating gate surface area may be minimized to improve the coupling ratio. Improving the coupling ratio may permit programming the gate at a lower voltage level. Carriers may be injected from the control gate to the floating gate.

According to another embodiment, the regular thin gate oxide may be utilized as a tunneling oxide for the NVRAM cell. The large floating gate surface area improves the coupling ratio. As stated above, roughening the surface of the floating gate is not necessary to achieve the increased surface area.

Programming of both of these embodiments of the NVRAM cell according to the present invention may be performed according to conventional methods. Alternatively, programming may occur from the floating gate to the drain or substrate or vice versa.

The control gate in the NVRAM cell preferably is a doped polysilicon. After being deposited, the polysilicon is patterned so that it forms the control gate for the NVRAM.

FIG. 2b shows an embodiment of a stacked capacitor DRAM according to the present invention. Similar to the NVRAM structure shown in FIG. 2a, the DRAM structure includes the source 62 (bit line diffusion), drain 64 (storage node diffusion) and shallow trench isolation regions (66,68). A DRAM according to the invention may also include a gate structure 72 and stud interconnections 76 and 78 similar to the NVRAM cell structure described above. However, as can be seen in the embodiment shown in FIG. 2b, the stud interconnections may only be formed above the source region 62 and drain region 64 and not the gate structure 72 in the DRAM cell according to the present invention.

After forming the stud interconnections, the first level metallization may be formed. However, in the embodiment of the DRAM shown in FIG. 2b, the first level of metallization 80 may only be connected to the source 62 rather than the source and the drain as in the embodiment of the NVRAM shown in FIG. 2a. Furthermore, the first level metallization of a DRAM according to the present invention may have a bit line 80 in a horizontal direction and a word line 72 in a vertical direction.

The word line may be formed of silicided polysilicon. For example, titanium may be deposited on the surface of the polysilicon. After annealing at a certain temperature for a period of time, titanium reacts with polysilicon to form titanium silicide (TiSi with low resistivity).

As can be seen in the embodiment shown in FIG. 2b, the DRAM structure preferably includes a second dielectric layer 82. A via 84 may be formed in the second dielectric 82 of the DRAM structure as in the NVRAM structure. However, in the DRAM structure, the via opens on the stud interconnect 78 connected to the drain (storage node diffusion) 64, rather than the gate 30 of the NVRAM.

According to the present invention, a capacitor, or node plate, for the DRAM cell is provided in the via 84, the space above the via, and the surface of the second dielectric layer 82 surrounding the via. The capacitor of the DRAM cell may be made of polysilicon. The polysilicon may be doped in-situ. Doped polysilicon is the most suitable material for this structure because it may be used to form the control gate of the NVRAM and the body of the SRAM. Alternatively, it is also possible to use compatible materials such as platinum, a diffusion barrier film (e.g., TiN) and a ferroelectric dielectric (e.g., $SrBi_2Ta_2O_9$—(SBT) or $Pb(Zr,Ti)O_3$—(PZT)) to form a ferro-electric RAM cell structure in FIG. 2b instead of the DRAM cell structure, by using conventional block out masks (not shown). As described with reference to FIG. 2b, the platinum can form the node plate 86 with an overlying diffusion barrier film 88 of e.g., TiN, and the ferro-electric dielectric can form the dielectric 89. See also, for example, the cross-sectional view of a ferro-electric RAM cell structure shown in FIG. 10. Processes for forming ferro-electric RAM cell structures per se are well known to those skilled in the art. See, for example, the following publications which are all hereby incorporated in the entireties by reference:

"Ferro-electric non-volatile memories for low voltage, low power applications," by R. E. Jones, Jr., et al., *Thin Solid Films*, Vol 270, No. 1–2, (Elsevier, Dec. 1, 1995); "Advanced 0.5 um FRAM Device Technology with Full Compatibility of Half-Micron CMOS Logic defice, by Tatsoya Yamazaki et al, IEDM 97, pgs 613–616; "A High Stability Electrode Technology for Stacked $SrBi_2Ta_2O_9$ Capacitors Applicable to Advanced Ferrelectric Memory," by J. Kudo, et al., IEDM 97, pgs 609–612; U.S. Pat. Nos: 5,850,231; 5,909,624; 5,850,089; 5,626,670; 5,608,246; 5,198,994; 4,888,630; 4,853,893.

However, the present invention can form a FERAM cell structure in lieu of or in combination with various other memory cell structures.

As described above, regarding the NVRAM cell, the surface of the capacitor or node plate 86 of the DRAM cell may be roughened. The present invention alternatively, includes roughening only the node dielectric (node plate) of the DRAM, but not the FG 54 of the NVRAM or the TFT dielectric (discussed below), by using a conventional block out mask. A thin layer of dielectric material may be grown or deposited over the surface of the capacitor of the node plate. The ground plate 92 (e.g., polycrystalline silicon) of the DRAM is disposed on top of the thin dielectric 89 layer as well as the surrounding surface of the second dielectric layer 82 surrounding the capacitor or node plate of the DRAM. If the surface of the capacitor or node plate is roughened, the roughened surface preferably is duplicated in the thin dielectric layer and the lower surface of the ground plate.

Figure 7A:
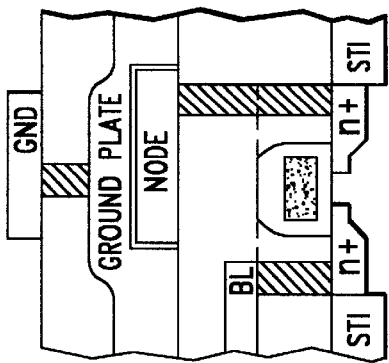
FIGS. 7a–c represent cross-sectional views of the memory cells schematically shown in FIGS. 6a–c.
Figure 7B:
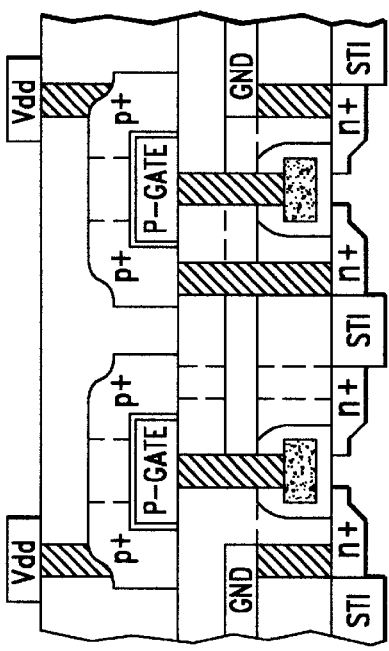
Figure 8A:
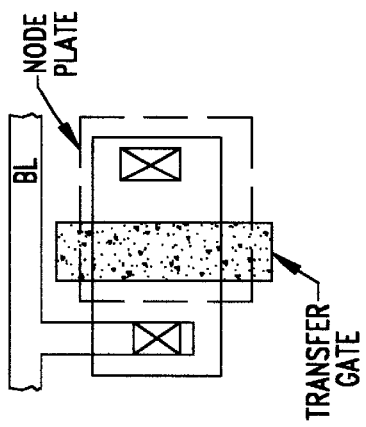
FIGS. 8a–c represent overhead views of the memory cells shown in FIGS. 6a–c and 7a–c.
Figure 8B:
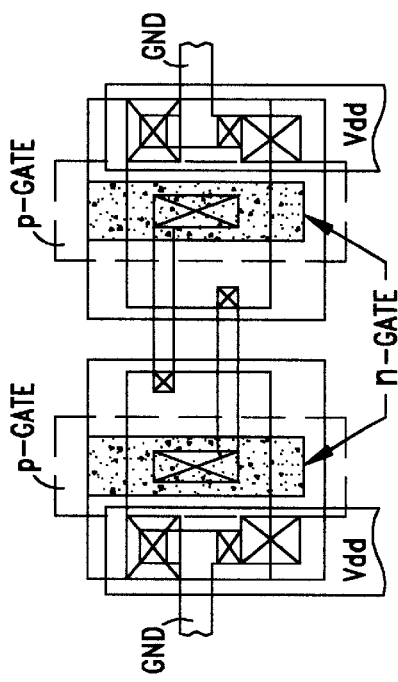

As stated above, the present invention may also be utilized to form an SRAM cell structure in the same memory device as the NVRAM and/or the DRAM cells discussed above. An embodiment of an SRAM according to the present invention is shown in FIG. 2c. FIG. 2c shows only one-half latch, one TFT device and one pull-down nfet. The other one-half latch should be substantially similar on the other side. Therefore, it is not shown in FIG. 2c. On the other hand, FIG. 7b and FIG. 8b show a whole back-to-back SRAM latch, which includes two pull-up pfet TFT and two pull-down nfet devices, while two transfer gates are not shown.

The SRAM structure shown in FIG. 2c includes a source region 94 and a drain region 96 as with the NVRAM and DRAM structures described above. Shallow trench isolation regions 98 and 100 may also be provided adjacent the source region 94 and drain region 96, respectively.

As with the NVRAM and DRAM structures above, the SRAM preferably includes a gate 102 including a gate structure (eg, a conductor structure) 104 and an isolation structure 106. Again, similar to the above NVRAM and DRAM structures, the gate structure 104 may be separated from the substrate by an insulating layer 107. The insulating layer may be a layer of an oxide material. Preferably, the insulating layer 107 is silicon dioxide.

The SRAM structure shown in FIG. 2c includes a stud interconnection 110 connected to the gate 102. The SRAM structure also includes the first dielectric layer 108 on top of the substrate including the source, drain, and isolation regions 94, 96, and 98 and 100, respectively. The first dielectric layer may also extend at least partially over the gate 102. The materials discussed above may also be used in forming the stud interconnection 110 of the SRAM structure.

Unlike the NVRAM structure and DRAM structure shown in FIGS. 2a and 2b, the SRAM structure shown in FIG. 2c does not include a first level metallization. However, the second layer dielectric 112 is provided over the first layer of dielectric 108. Additionally, a via 114 is provided in the second dielectric layer.

Figure 6B:
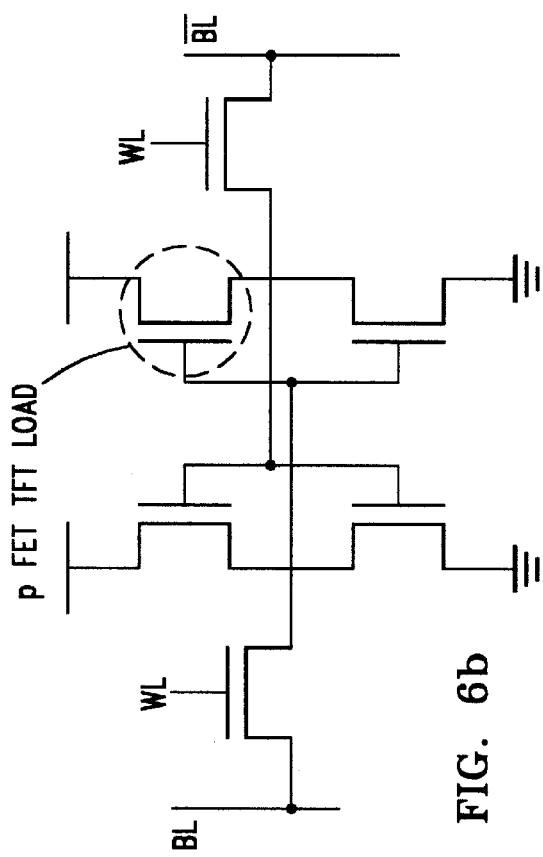
FIGS. 6a–c represent schematic views of embodiments of a NVRAM cell (e.g., a flash PROM cell), a TFT SRAM cell, and a DRAM stacked-cap cell according to the present invention.
Figure 6D:
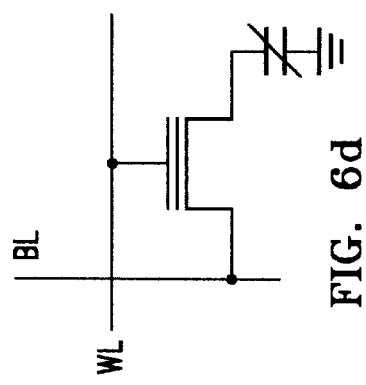
FIGS. 6d is a schematic circuit of a FERAM cell employed in an alternative embodiment of the present invention.

In the SRAM structure according to the present invention, a TFT gate 118 is located in the via, the space above the via 114, and space above the surface of the second dielectric layer 112 surrounding the via. The TFT gate 118 may be formed of a polysiliocn. A, for example, polycrystalline Si TFT body 126 overlies the TFT gate 118. The body 126 includes e.g. P+ source and drain diffusions. The gate (ptype load transistor) 118 is needed together with a pull-down n-fet transistor to form an inverter. For a full SRAM, two back-to-back inverters are required to form a full-latch. Schematics of this structure are shown in FIGS. 6b and 7b.

As discussed above for the NVRAM and DRAM cells, the surface of the TFT gate 118 may optionally be roughened. The process(es) utilized above to roughen the surface of the node plate and floating gate of the DRAM and NVRAM cells, respectively, may be simultaneously used to roughen the surface of the TFT gate of the SRAM cell. By using a suitable conventional block out mask (not shown), one can selectively roughen the appropriate dielectric herein as desired. A thin layer of dielectric 122 may be grown or deposited on a portion of the surface 120 of the TFT gate over which the TFT body may be located or otherwise disposed. The TFT body 126 is shown in FIG. 2c. The surface 124 of the TFT body adjacent the thin dielectric layer 122 may be roughened, because the material of the TFT body is laid down over the roughened surface of the TFT gate.

Figure 9C:
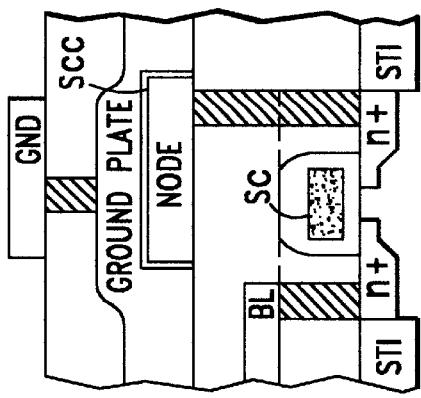
FIGS. 9a–c correspond to FIGS. 7a–c, but show further that, in a preferred aspect of the invention, at least two of the gates surfaces Sa, Sb, Sc of the memory cells are substantially perpendicular to thickness dimensions t and are substantially coplanar and/or at least two of the top surfaces Saa, Sbb, Scc of the memory cells are substantially perpendicular to thickness dimensions T are substantially coplanar.
Figure 9B:
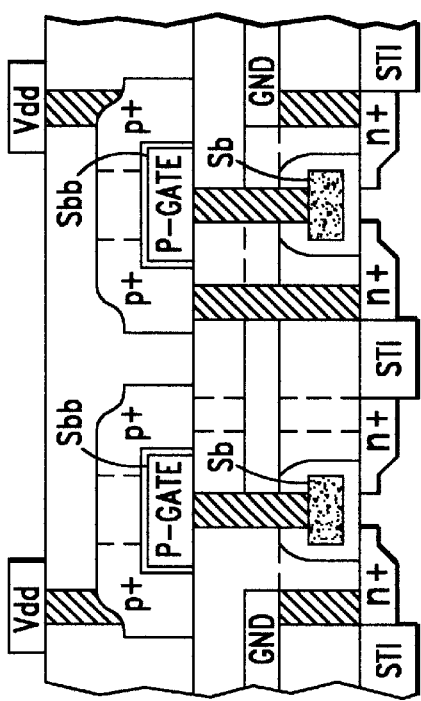

The embodiment of the SRAM cell shown in FIGS. 7b, 8b and 9b includes two back-to-back inverters including two pull-up TFT load p-fet devices and two n-fet devices.

Figure 3A:
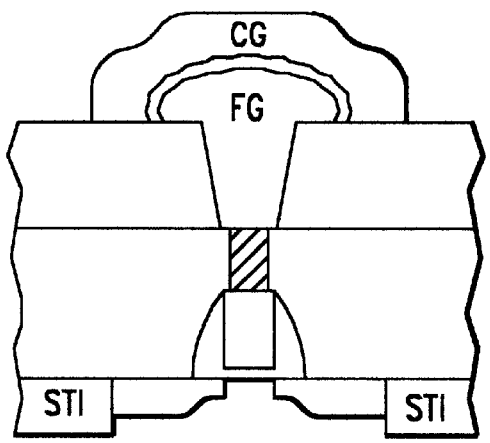
FIG. 3a represents a cross-sectional view of one embodiment of an NVRAM cell structure formed according to the present invention that includes an optional roughened area on the floating gate and the control gate.

FIG. 3a shows an embodiment of the NVRAM structure that includes a floating gate that has a smaller upper surface area. The smaller surface area may improve the coupling ratio, permitting use of a lower voltage level. Carriers may be injected from the control gate to the floating gate or vice versa. As stated above, the surfaces of the floating gate and the control gate need not be roughened.

Embodiments of the NVRAM structure described in connection with FIG. 3a include a thin dielectric layer or tunnel oxide between the floating gate and the control gate. Such embodiments may include a tunnel oxide of about 80 Å.

Figure 3B:
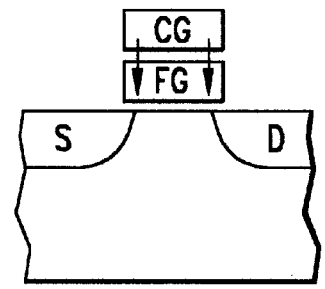
FIG. 3b represents a conventional structure of a NVRAM cell, corresponding to the new structure shown in FIG. 3a, wherein programming is carried out from the control gate to the floating gate.

FIG. 3b shows an embodiment of a conventional NVRAM cell structure corresponding to an embodiment of the invention shown in FIG. 3a.

Figure 4A:
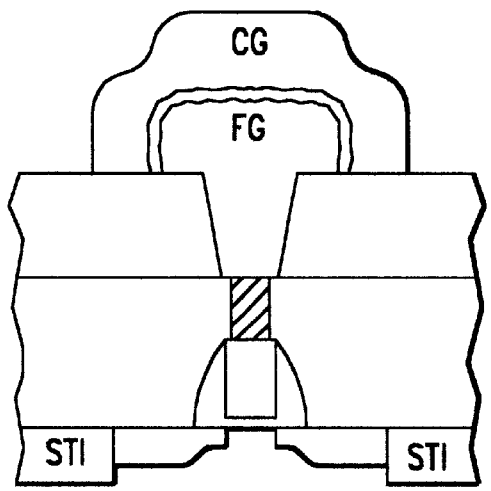
Figure 4B:
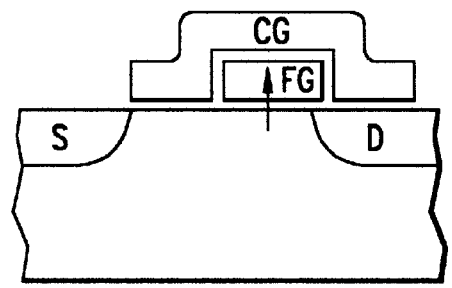
FIG. 4b represents a conventional structure of an NVRAM cell, corresponding to the new structure shown in FIG. 4a, wherein programming is carried out from the drain or substrate to the floating gate.

FIG. 4a shows an embodiment of an NVRAM structure according to the present invention wherein the floating gate has a larger upper surface area. Embodiments of the NVRAM structure according to the present invention that include such a floating gate may include a less roughened or a smooth upper surface. The larger overall surface area of the floating gate accommodates the less surface area created by a lesser degree of roughening. However, as stated above, the surfaces of the control gate and the floating gate need not be roughened.

Embodiments of the NVRAM structure shown in FIG. 4a preferably include a tunnel oxide of about 30–40 Å.

Figure 6A:
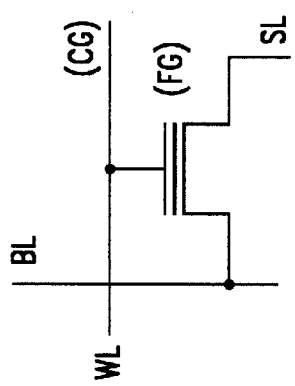
Figure 6C:
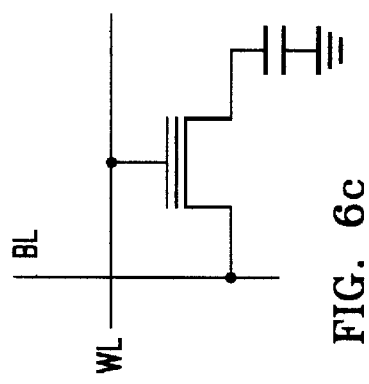
Figure 7C:
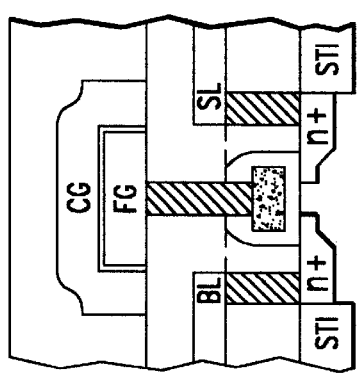
Figure 8C:
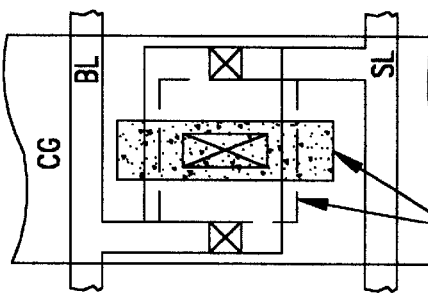

As discussed above, the present invention also includes methods for forming NVRAM cell structures, DRAM cell structures, and SRAM cell structures in the same semiconductor memory device. FIGS. 5a–l show cross sectional views of various points in processes according to the present invention for forming the structures shown in FIGS. 7a–c and 8a–c. FIGS. 7a–c show cross sectional views of a flash PROM cell, a TFT SRAM, and a stacked capacitor DRAM cell, respectively, according to the present invention. FIGS. 8a–c show overhead views of the structures shown in FIGS. 7a–c, respectively. FIGS. 6a–c represent schematic circuit diagrams of the memory cells shown in FIGS. 7a–c, respectively.

Figure 9A:
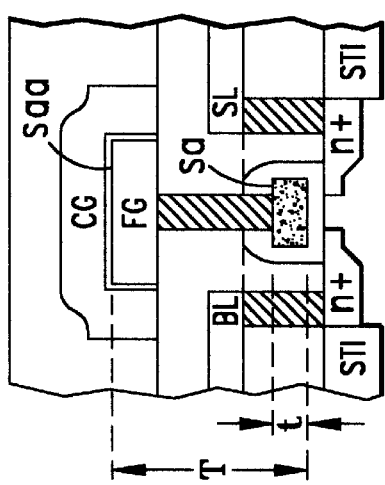
Figure 10:
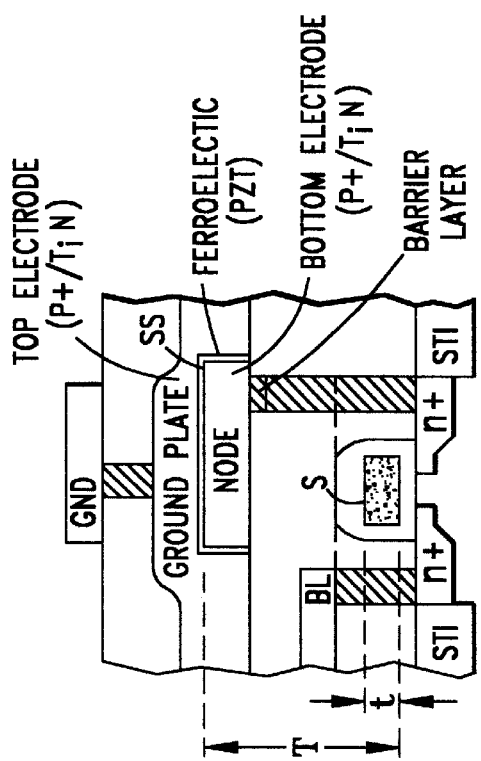
FIG. 10 is a cross-sectional view of a ferro-electric RAM which optionally is employed in a semiconductor memory device according to the present invention; preferably, the gates surface S is substantially perpendicular to the thickness dimension t and substantially coplanar with at least one of the gate surfaces Sa, Sb, Sc, and/or the top surface SS is substantially perpendicular to the thickness dimension T and substantially coplanar with at least one of top surfaces Saa, Sbb, Scc.

FIGS. 9a–c correspond to FIGS. 7a–c, but show thickness dimensions "t" of the lower gate structures. The thickness t is, for example, a substantially (±10%) constant or uniform 200 nm. Of course, other substantially constant thicknesses are contemplated herein-e.g., from approximately 50 nm to approximately 300 nm. Each lower gate structure has a respective top surface Sa, Sb, Sc which is substantially perpendicular to the respective dimension t and which is substantially planar. In FIGS. 9a–c, the lower gate structures of the SRAM (FIG. 9b) and of the DRAM (FIG. 9c) have substantially the same thicknesses t as that of the lower gate structure of the NVRAM (FIG. 9a). In a preferred aspect of the present invention, the top surfaces of at least two cell structures (eg, surface Sa, and both surfaces Sb) are sub-stantially coplanar (i.e., lie substantially within a same plane). In a further preferred aspect, all of the surfaces Sa, Sb, Sb, Sc are substantially coplanar.

FIGS. 9a–c also show thickness dimensions "T". In FIG. 9a the dimension T extends, e.g. from the bottom surface of the lower gate structure to a top surface Saa of the floating gate FG. The thickness T is, for example, a substantially constant or uniform 800 nm. Of course, other substantially constant thicknesses are contemplated herein-e.g., from approximately 200 nm to approximately 1500 nm. The cell structures have gate top surfaces Saa, Sbb, Sbb or node top surfaces Scc, SS which are substantially perpendicular to the dimensions T and which are substantially planar. Preferably, the top surfaces of at least two cell structures are substantially coplanar.

In FIGS. 5a–l, the left-hand memory cell corresponds to the flash PROM cell shown in FIGS. 7a, 8a and 9a. The central memory cell shown in FIGS. 5a–l corresponds to the TFT SRAM cell shown in FIGS. 7b,8b and 9b. Additionally, the right-hand memory cell shown being formed in FIGS. 5a–l corresponds to the stacked capacitor DRAM cell shown in FIGS. 7c, 8c and 9c. Minor variations unimportant for an understanding of the present invention exist between the cells shown in FIG. 5 and the corresponding cells shown in FIGS. 7, 8 and 9.

All of these processes begin by providing a substrate, and forming isolation and gate levels according to conventional methods that are well known in the art. The same processes may be utilized to form the source regions, drain regions, trench isolation regions, and gate structures shown in FIGS. 2a, 2b and 2c. Separate ion implantation masking steps may be required to optimize the Vt's of the DRAM and the NVRAM devices. The source, drain and gate structures may all be silicided for low resistivity. Subsequent levels formed over the gate level are utilized by each type of memory cell for different purposes. Because the levels preferably are present in each type of cell, substantial (±10%) coplanarity is propagated upwardly during cell formations.

Figure 5A:
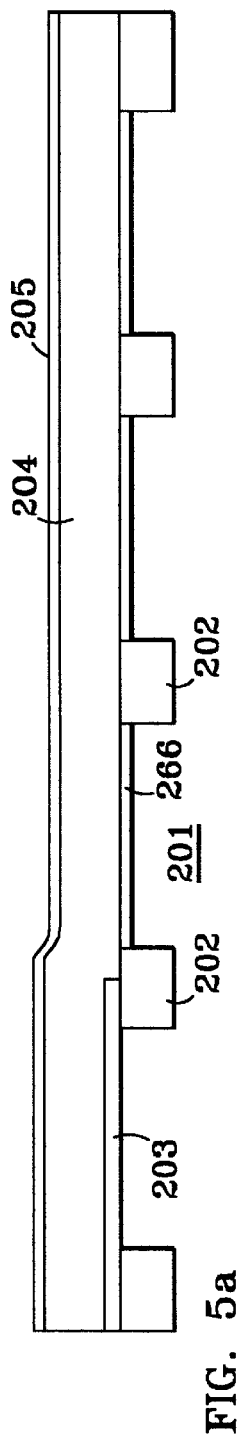
FIGS. 5a–l represent cross-sectional views of an embodiment of a semiconductor memory device according to the present invention during various stages of an embodiment of a manufacturing process according to the present invention.

Accordingly, the process of forming the memory cells begins by forming the structure shown in FIG. 5a. FIG. 5a shows a semiconductor substrate 201 including all of the well implants, such as n-well, p-well, and others. These implants may be formed according to conventional processes. Shallow isolation regions 202 preferably are also formed according to conventional processes.

At least one portion of the substrate 201 may be covered with a layer of pad insulation material 203. Examples of materials that may be utilized in the pad include oxide and nitride.

The remainder of the surface of the substrate may be formed with a layer of a gate oxide 266. Examples of materials that may be utilized to form the gate oxide (e.g., a dielectric) include a thermal oxide or oxynitride, a CVD oxide, or a CVD nitride. The gate oxide may have a thickness of about 6 nm to about 12 nm.

A first layer of a polysilicon 204 may be deposited over the structure formed up to thus far. The polysilicon 204 may be formed by CVD. A thin layer of a nitride 205 may then be deposited over the first polysilicon layer 204. The nitride layer 205 may also be formed by CVD. After formation of the nitride layer, the structure should appear as shown in FIG. 5a.

Figure 5B:
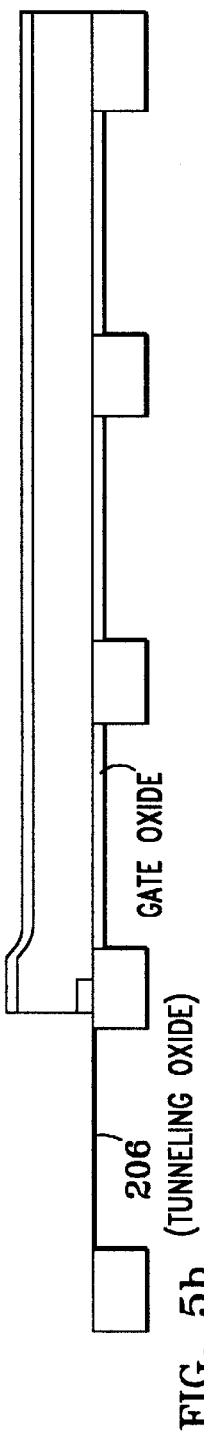

In FIG. 5b, a portion of the top nitride layer 205 on top of the polysilicon layer 204 and the pad material 203 is removed. The removal may be accomplished by a reactive ion etch process step. An exposed portion of the polysilicon layer 204 is removed. The pad material may be utilized for etch stop for etching of the polysilicon layer 204, and then is also removed. An example of a process that may be utilized to remove the pad material includes a wet etch and wet cleaning step.

A very thin layer of a dielectric 206 may then be formed on the exposed surface of the silicon substrate. The dielectric may be a thermal oxide layer and may be formed by being grown on the exposed (e.g., silicon) surface. The dielectric layer is also referred to as a tunneling oxide and may have a thickness of about 3 nm to about 5 nm. This layer is very thin and is represented by a thin line in FIG. 5b. The structure formed up to this point is shown in FIG. 5b.

Figure 5C:
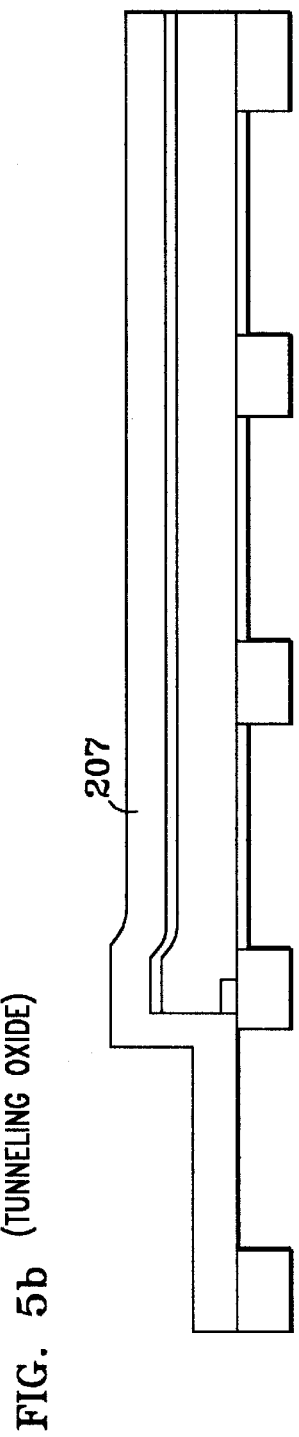

As shown in FIG. 5c, a second layer of a polysilicon 207 may be formed over the entire structure as shown in FIG. 5b. The second polysilicon layer 207 may be deposited by CVD. Preferably, the layer 207 has a thickness substantially equal to the thickness of the layer 204.

Figure 5D:
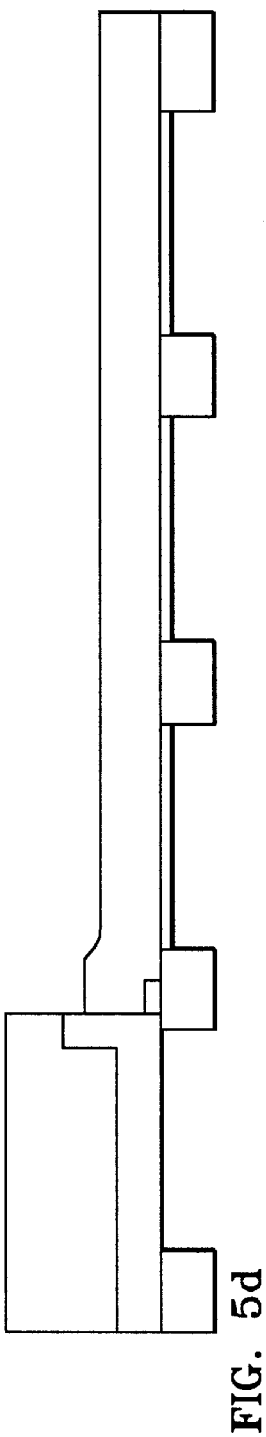

As shown in FIG. 5d, a photolithography resist pattern or block out mask 208 may be utilized to remove portions of the second polysilicon layer 207 lying over the first polysilicon layer 204. The photolithography resist pattern may then be stripped.

Figure 5E:
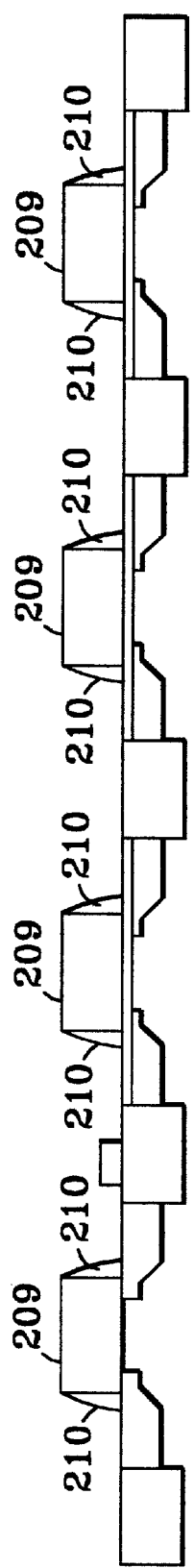

Gates of three devices, NVRAM, SRAM, and DRAM, may be formed in a conventional etch process. Sidewall spacers 210 may be formed by deposition of a dielectric material and tailored by a blanket etch. Source and drain diffusions are also formed. The resulting structure is shown in FIG. 5e. According to a preferred aspect of the present invention, all top surfaces of the gate structures 209 resulting from this etch process are substantially coplanar.

Figure 5F:
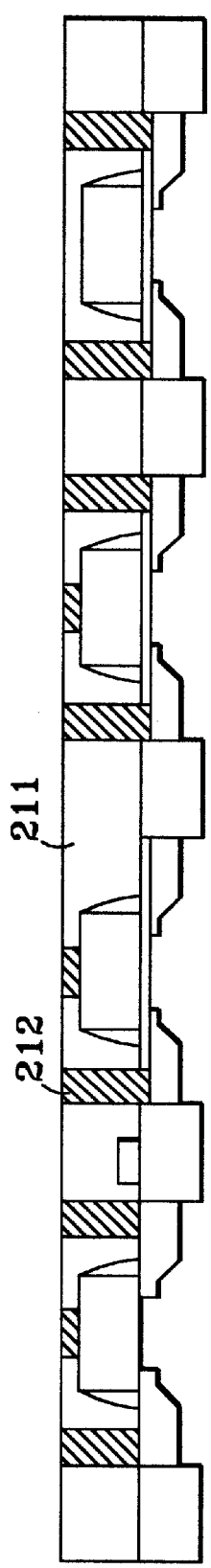

Next, the first dielectric layer 211 and the stud interconnections 212 may be formed according to conventional processes. As stated above, the stud interconnections in the NVRAM cell may only extend from the source, drain, and gate, whereas in the DRAM cell the stud interconnections may only extend from the source and drain. FIG. 5f shows a cross-sectional view of the devices after formation of the first dielectric layer and the stud interconnections.

Figure 5G:
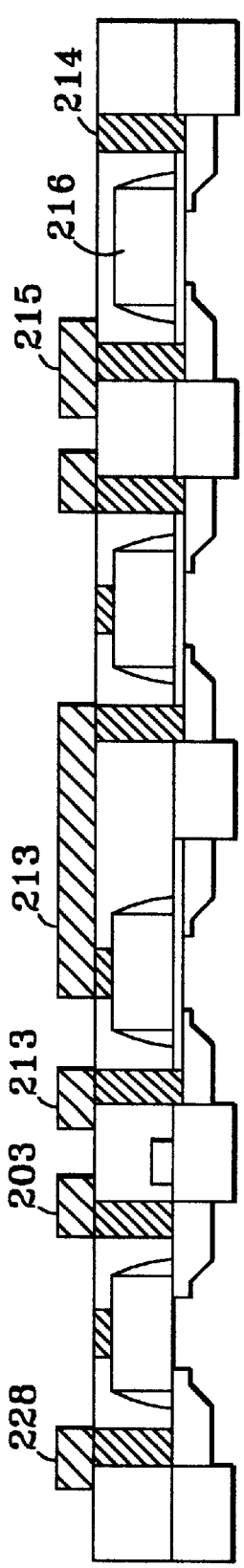

A first level metallization 213 may then be formed over the first dielectric layer and the stud interconnections. The metallization may be defined or accomplished according to or with known, conventional means. The metallization and the overall structure are shown in a cross-sectional view in FIG. 5g. As can be seen in FIG. 5g, an NVRAM structure according to the invention includes metallization including a source line 228 and a bit line 203 running in a horizontal direction. On the other hand, the DRAM structure shown in FIG. 5g includes a bit line 215 running in a horizontal direction. The DRAM also includes a word line 216, which is the polysilicon gate, in the vertical direction.

Figure 5H:
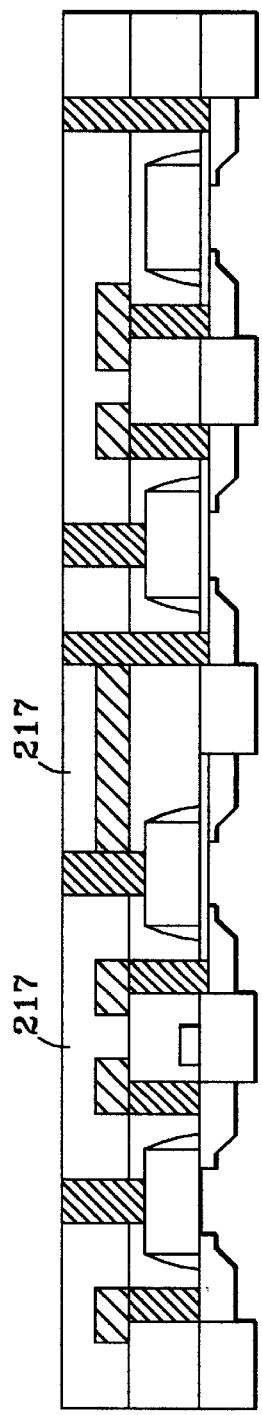

After the first level metallization has been laid down, a second layer of a dielectric material 217 may be deposited on the surface of the substrate and the first level metallization 213. Vias may then formed in the second dielectric layer. The location of the vias depends on the type of memory cell structure being formed. For example, in the NVRAM cell, the via is formed over the stud interconnection connected to the gate structure. This is shown in the left hand portion of FIG. 5h. As shown in FIG. 5h, the via may also extend to the surface of the second dielectric layer and an area in the vicinity of the second stud interconnection.

On the other hand, if the process of the present invention is being utilized to form a DRAM cell structure or an SRAM cell structure, the via preferably is formed over the stud interconnection connected to the drain region. This is shown in the right-hand portion and central portion, respectively, of FIG. 5h. Similarly to the above, the via may also extend about the surface area of the second dielectric layer in the vicinity of the stud interconnection connected to the drain region.

The second dielectric layer and via may be formed according to conventional methods.

As shown in FIG. 5h, in some instances, stud interconnections may be formed through the first and second dielectric layers to the source region or drain region in the substrate or to the gate structures formed on the substrate. Such stud connections may extend up as far as the top surface of the second dielectric layer.

Once the vias are formed, a conductive material preferably is deposited therein, as shown in FIG. 5h.

Next, the process includes forming functional portions of the DRAM, SRAM, and/or NVRAM cell structures. Forming the functional portions of the memory cells begins by forming a layer of material over the vias and stud interconnections formed in the second dielectric layer and on the surface of the second layer dielectric material surrounding the vias and stud interconnections. According to preferred embodiments, the material is an in-situ doped polysilicon. In this case, this can be considered a third polysilicon layer. The material is then patterned, according to the memory cell to be formed. For example, if the process is being utilized for forming an NVRAM cell, the material 218 is patterned to cover an area on and around the via or forming the floating gate extension of the NVRAM cell. Material 218 and 219 and the stud in between may form the whole floating gate of the NVRAM cell.

Alternatively, if the embodiment of the invention includes stud interconnections formed through the second dielectric layer, the functional portions of the memory structures may be formed by patterning the material so that it remains above the stud interconnections, extending on the surface of the second dielectric layer in the vicinity of the stud interconnections.

As discussed above, the present invention may also be utilized for forming a DRAM cell. If the process is being utilized to form the DRAM cell, the material is patterned, resulting in structure 220, so as to remain on and around the vias or the stud interconnections and on the surrounding surface of the second dielectric layer, thus, forming the capacitor or node plate of the DRAM cell. As has been mentioned earlier, the material 220 alternatively can be a ferro-electric compatible conductor, such as platinum or other suitable noble metals or compounds thereof (e.g., Ru, Ag, Pd, $RuO_2$, $IrO_2$). This conductor material can then be deposited and patterned separately, using a conventional block-out mask (not shown) and conventional techniques, from other conductor material(s) (such as the materials 218,221 and 222) used for the NVRAM and SRAM cells.

If the invention is being utilized to form an SRAM cell, the via or stud interconnection may be formed in the second dielectric layer only over the stud interconnection connected to the gate as discussed above for the NVRAM cell. The patterned material 221 and 222 on and around the via, or on and around the stud interconnection, is a material suitable for forming gates of thin film transistor devices of the SRAM cell. An example of such a material is a doped polysilicon. The doped polysilicon may be p-type or n-type, depending on the type of device. Indeed, gate material 221, which connected with gate 223, and gate 222 which connected with gate 224 by interconnection studs, are the gate for both top pfet devices as well as for bottom nfet devices.

Once the material is patterned, the exposed surface of the material may then be subjected to a roughening process. Examples of such roughening processes are described above. By using an extra conventional mask (not shown), one can optionally perform a selective roughening only on the dielectric of a specifically selected device.

After patterning the material or also roughening the surface of the patterned material, a thin layer of a dielectric material 225 is deposited over the roughened surface. This dielectric may function as a tunnel layer. As can be appreciated from the embodiments shown in FIGS. 3a and 4a, if the surface of the patterned material is roughened, the roughened surface is reproduced in the dielectric deposited thereon. If the dielectric is substantially uniformly deposited over the entire roughened surface, it is in fact a relatively thin layer. In order to fabricate an optional ferro-electric RAM, one skilled in the art in view of the instant disclose can readily form a ferro-electric dielectric as the material 225 (FIG. 5j), such as SBT ($SrBi_2Ta_2O_9$—(SBT) or Pb ($Zr,Ti)O_3$—PZT)), only on the DRAM area (right hand side of FIG. 5) using a conventional block out mask (not shown); the diffusion barrier film is disposed between the platinum node electrode 220 and the underlying stud which connects to the node diffusion.

After depositing the dielectric on the patterned and possibly roughened surface, a layer of another conductive material is deposited on the dielectric deposited on the patterned material and the exposed surface of the second dielectric layer. This layer may be a third polysilicon layer 226. FIG. 5j shows the structure after deposition of the third polysilicon layer. Preferably, the top surfaces J of the layer 226 are substantially coplanar.

Figure 5I:
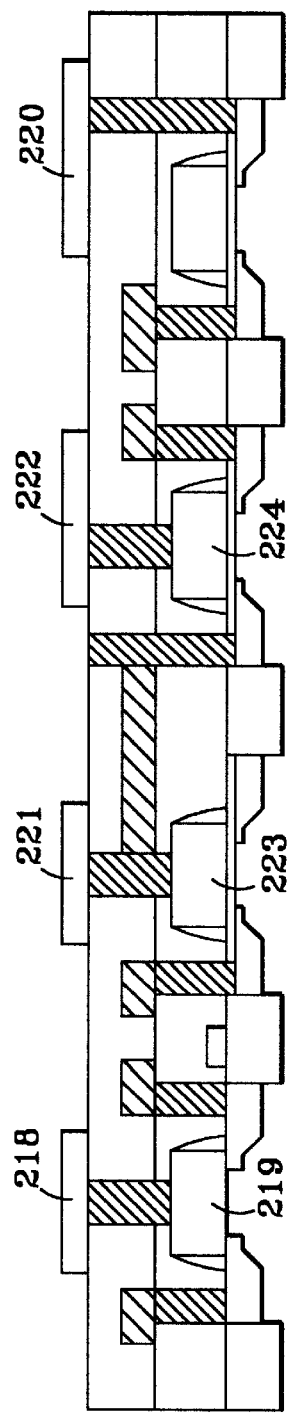
Figure 5J:
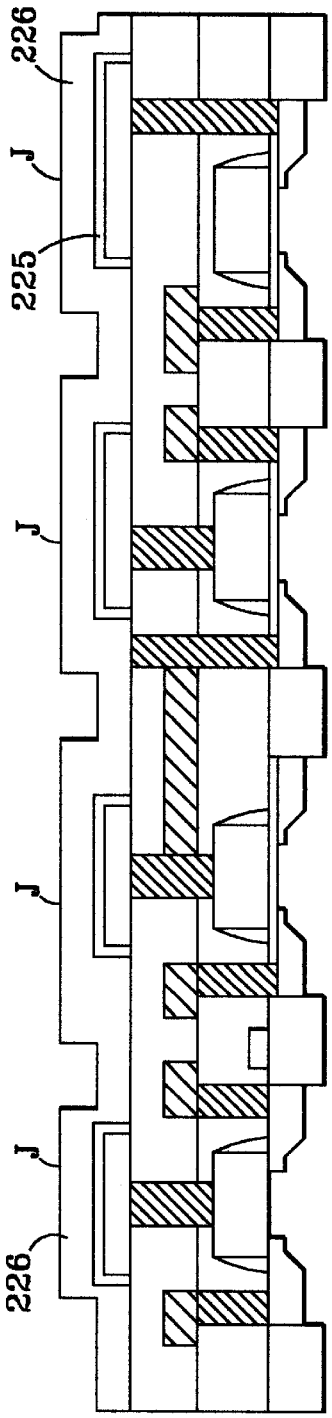
Figure 5K:
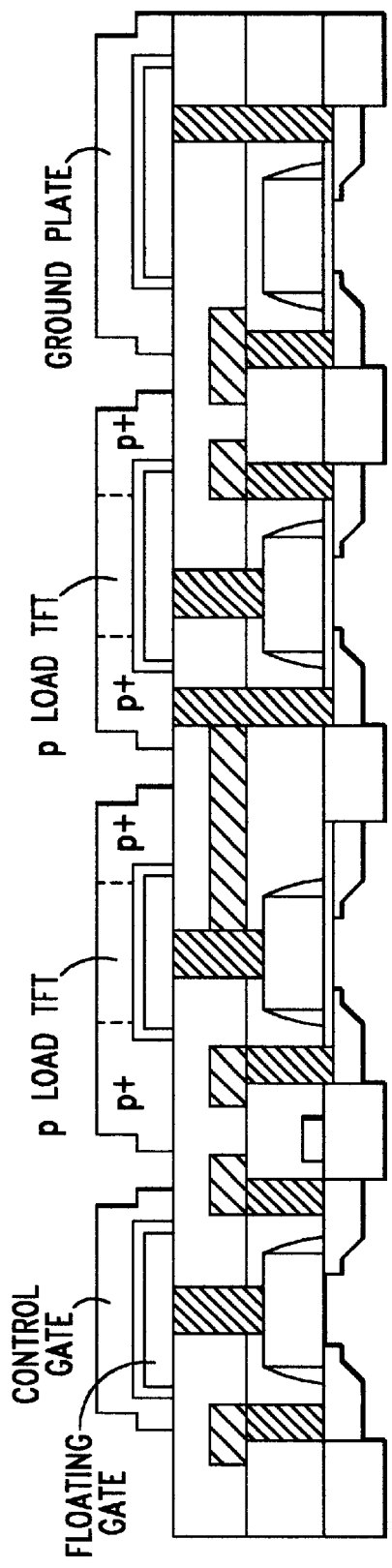
Figure 5L:
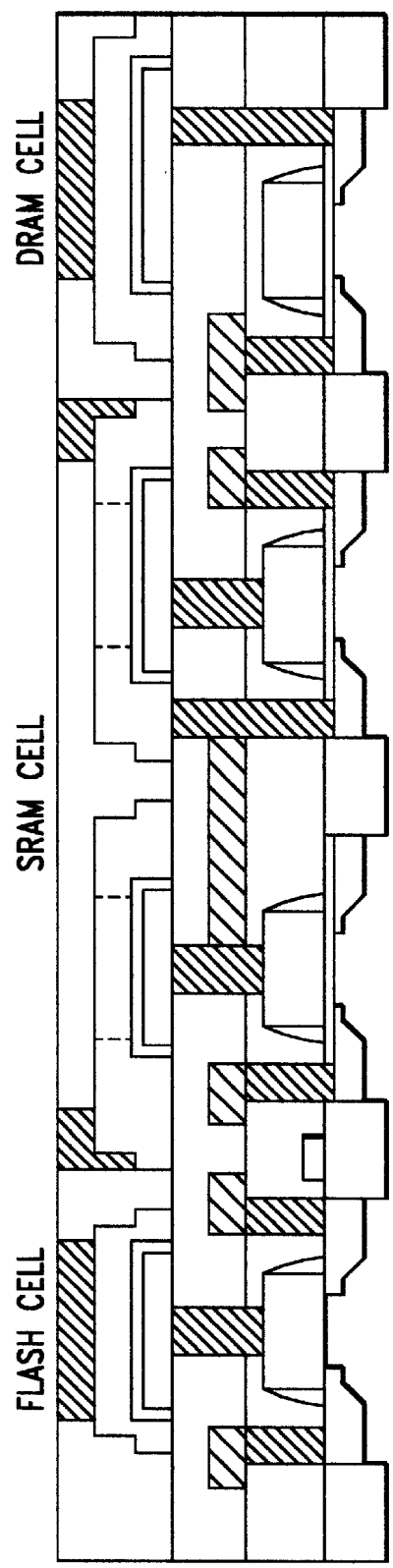
Figure 5H:
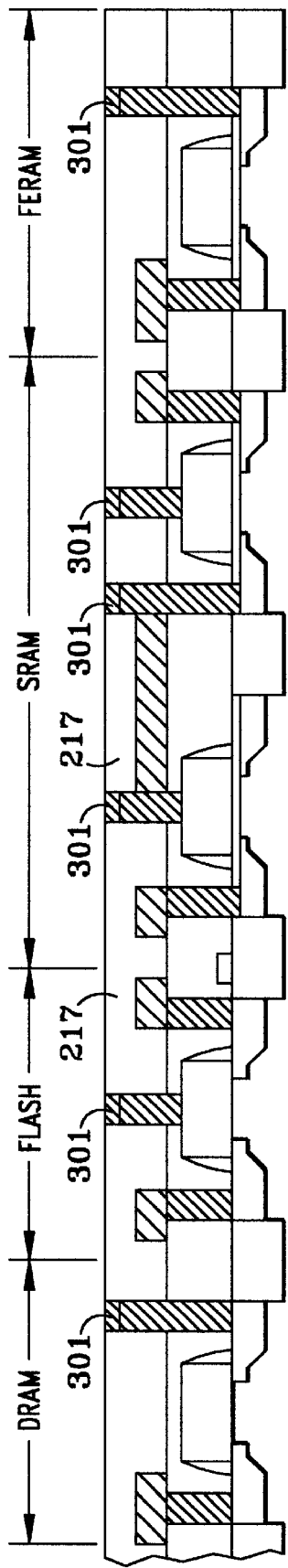
Figure 5I:
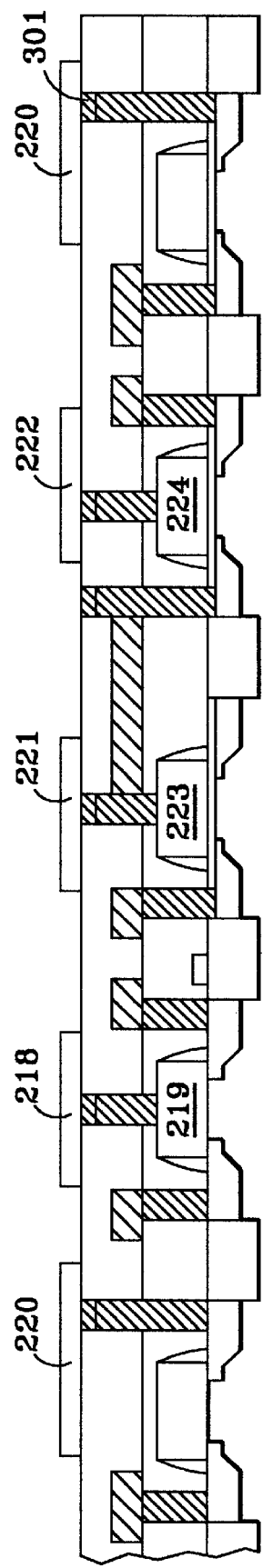
Figure 5J:
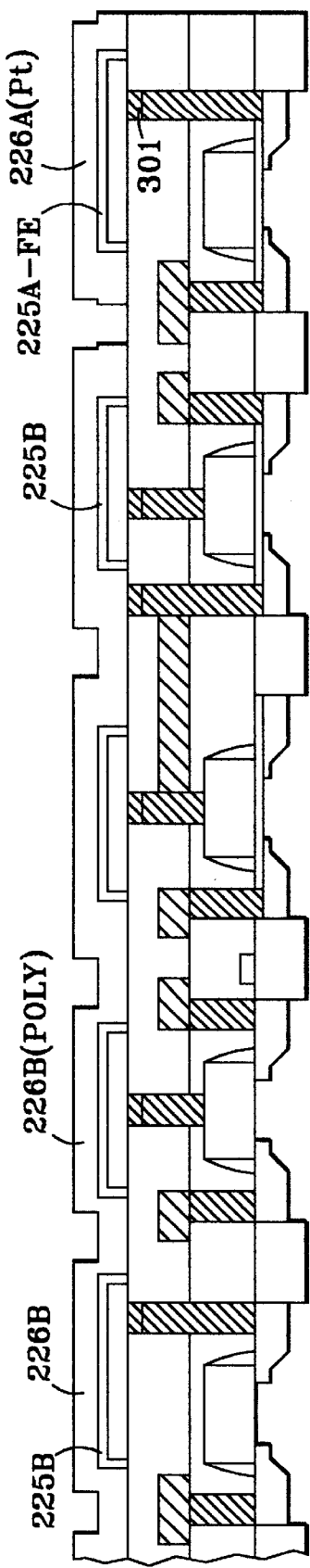
Figure 5K:
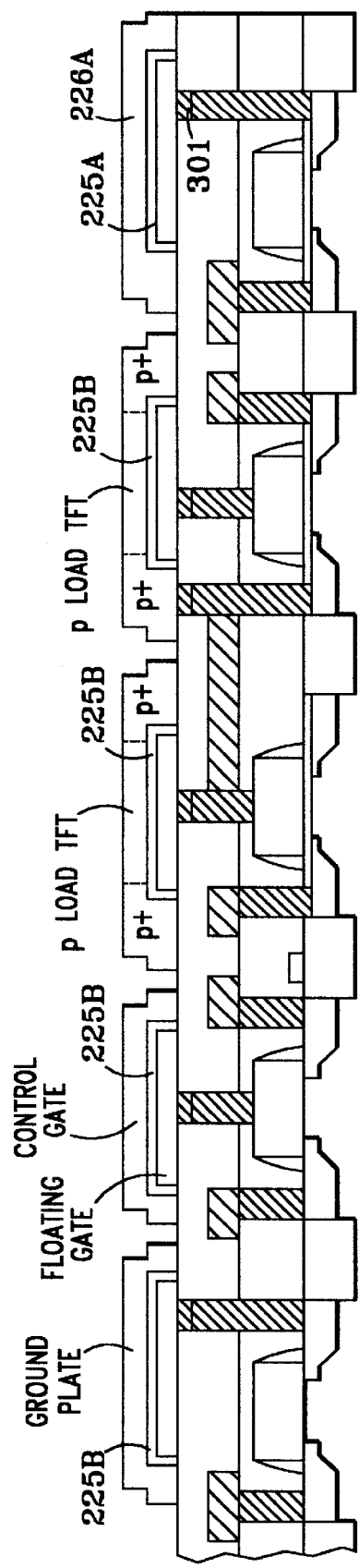
Figure 5I:
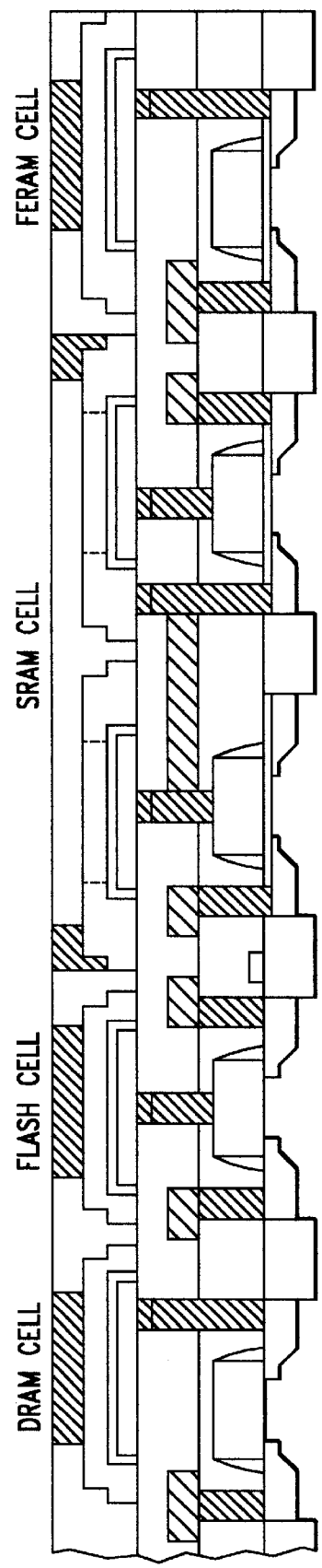

The third polysilicon layer may then be patterned, as shown in FIG. 5k. The function of the third polysilicon layer varies, depending upon the type of memory cell being produced. If the cell is an NVRAM cell, the material should be suitable for forming a control gate of the NVRAM cell. If the cell is a DRAM cell, the material should be suitable for forming the ground plate of the DRAM. If the cell is optionally a ferro-electric RAM cell, the ground plate material must be a platinum material and/or a suitable equivalent such as another suitable noble metal or compounds thereof. If the cell is an SRAM cell structure, the material deposited on the dielectric should be suitable for forming a TFT body of the SRAM. The patterned material may require further processing, depending upon the required function. FIG. 5k also shows patterned and ion implantation processing have occurred in the SRAM cell, to form p+ regions formed toward the periphery as a source/drain of the top thin film transistor devices. The processing may continue as shown in FIG. 5l.

Once the memory cell structures are complete, additional processes may be carried out for forming other functional connections to the memory cell structures.

In a further alternative embodiment of the invention, the semiconductor memory device includes four different types of memory cells—NVRAM, DRAM, SRAM and FERAM cells.

A process for forming these four different memory cell structures on a single substrate is described with reference to FIGS. 5a–g and FIGS. 5hh–5ll. For FIGS. 5a–g, the process has been previously described, except that additional well implants, isolation regions 202, layers 204, 205, etc are required as would be well understood by those skilled in the art in view of the instant disclosure. Also, the locations of the various cell structures are changed between FIGS. 5a–g and FIGS. 5hh–5ll.

Referring to FIGS. 5hh–5ll, the following steps are preferably performed.

FIG. 5hh: Recess the contact material (e.g. conductive material) by a suitably timed etch back. Either an isotropic or directional etch of the contact material, selective to adjacent materials, may be used.

Deposit a layer of conductive oxygen barrier material 301 such as TiN or WN with a proper thickness—e.g., a thickness in a range from approximately 5 to approximately 50 nm. Polish back and leave barrier material inside the recessed contact area. This material will protect polysilicon from being oxidized in a subsequent $O_2$ annealing step.

FIG. 5ii: Deposit a layer of a conductive material which is suitable for a FERAM process. This material can be Pt, Ir, Ru, Ag, Pd, $RuO_2$ or $IrO_2$. This material can be used also to form the gate conductor for the TFT (thin-film transistor) for the SRAM, portion of the floating gate for the flash, or the node electrode for the DRAM.

FIG. 5jj: Application of a block out mask.

First, deposit a thin layer of CVD oxide 225B, a layer of in-situ doped CVD polysilicon 226B and a protective layer of CVD nitride, over all of the devices.

Use a block out mask to remove the CVD nitride, polysilicon and oxide in the FERAM area. Deposit a thin layer of a ferroelectric dielectric 225A such as $SrBi_2Ta_2O_9$ (or SBT) by MOCVD, PVD or sol-gel.

Deposit a top electrode with a material 226A similar to that of the bottom electrode, and then deposit a cap nitride layer.

Etch and define the top electrode so it remains only in the FERAM area. Note: The cap nitride may be (although not necessarily) very thin and, thus, not shown in the drawing.

FIG. 5kk: Resist patterning and ion implantation to form source/drain for the TFT device of the SRAM, using conventional techniques.

FIG. 5ll: Deposit a layer of CVD TEOS oxide on top of the entire structure.

Conventionally anneal the entire structure in $O_2$ to form devices and to activate the FE capacitor. Open the dielectric to form contact in a conventional way.

A significant advantage of the present invention is that at least three different types of memory cells discussed above can be formed simultaneously because the present invention provides a similar structure that may be utilized in each type of memory cell. For example, the floating gate of the NVRAM cell may be formed at the same time as the node plate of a stacked capacitor of a DRAM cell. The floating gate, and the node plate may also be roughened at the same time. Additionally, the (e.g., thin) dielectric that is formed for the capacitor of the DRAM gate oxide for a TFT can also be a tunneling oxide of the NVRAM cell.

A field enhanced tunneling mechanism may be used to program the floating gate from the control gate due to the roughened polysilicon surface. Furthermore, the control gate of the NVRAM cell may be formed at the same time as the ground plate of the DRAM capacitor and the body of the TFT. If a ferro-electric RAM cell optionally is formed in lieu of or in addition to a DRAM cell, then the grounded plate must be a platinum material or a suitable equivalent such as other suitable noble metals or compounds thereof.

In order to implement NVRAM, DRAM or SRAM circuits, three additional process steps are required to form high voltage peripheral devices to handle high voltage operations. These steps may include thicker gate oxide, special LDD, and deeper junction implant. In order to implement a ferro-electric RAM circuit, additional process steps are required to form high voltage peripheral devices. These steps include, for example, forming a plurality of gate oxide thicknesses. Thicker gate oxide MOSFETS provide reliability for high voltage peripheral devices.

The present invention provides a DRAM and SRAM process compatible with a NVRAM cell structure. This structure and process for forming permits the incorporation of an NVRAM into a high density DRAM and SRAM memory architecture with a minimum cost penalty. Because one advantage of an NVRAM cell is a higher density and improved programming flexibility than a fuse, and because the present invention permits the NVRAM cell structure to be incorporated in a memory device including DRAM and SRAM, the present invention provides great advantages in forming memory and logic applications. In doing so, the present invention may permit using a single memory chip rather than separate memory chips integrated at a system level. Furthermore, the present invention provides a relatively simple process with relatively few steps, avoiding additional, complex process steps, multiple mask levels and material layers in fabricating multiple types of memory cells on a single chip. Optionally, the present invention includes a process for forming a ferro-electric RAM cell structure forming process compatible with the processes for forming the other memory cell structures.

The present disclosure shows and describes only preferred embodiments of the present invention. As aforementioned, those reading the disclosure should understand that the invention may be used in other combinations and environments and may be changed or modified within the scope of the inventive concept expressed herein. For example, an NVRAM structure may include a ROM or EEPROM, instead of a flash memory.

What is claimed is:

1. A semiconductor memory device, comprising:

a FERAM cell structure;

a SRAM cell structure, and a DRAM cell structure;

wherein said FERAM structure, said SRAM cell structure and said DRAM cell structure are on the same substrate and have gate surfaces which are substantially coplanar.

2. The semiconductor memory device as claimed in claim 1, further comprising a flash memory cells structure on said same substrate.

3. The semiconductor memory device as claimed in claim 1, wherein all of said cell structures have lower gate surfaces which are substantially coplanar.

4. The semiconductor memory device as claimed in claim 1, wherein said FERAM cell structure includes a node top surface which is substantially coplanar with a gate top surface of another of said cell structures.

5. A semiconductor memory device, comprising:

a FERAM cell structure;

a SRAM cell structure, and a NVRAM cell structure; wherein all of said cell structures are on the same substrate and include gate surfaces which are substantially coplanar.

6. The semiconductor device as claimed in claim 5, wherein at least two of said cell structures have lower gate surfaces which are substantially coplanar.

7. A semiconductor memory device, comprising:

a DRAM cell structure;

an NVRAM cell structure;

SRAM cell structure, and a FERAM cell structure;

wherein all of said cell structures are on the same substrate and have sate surfaces which are substantially coplanar.

* * * * *

UNITED STATES PATENT AND TRADEMARK OFFICE
CERTIFICATE OF CORRECTION

PATENT NO. : 6,259,126 B1
DATED : July 10, 2001
INVENTOR(S) : Louis Lu-Chen Hsu et al.

Page 1 of 1

It is certified that error appears in the above-identified patent and that said Letters Patent is hereby corrected as shown below:

<u>Column 16, claim 2,</u>
Line 8, change "cells" to -- cell --.

Signed and Sealed this

Fifth Day of March, 2002

Attest:

Attesting Officer

JAMES E. ROGAN
Director of the United States Patent and Trademark Office